(12) United States Patent
Chen

(10) Patent No.: US 6,980,436 B2
(45) Date of Patent: Dec. 27, 2005

(54) COMPUTER COOLING SYSTEM

(76) Inventor: Huang-Han Chen, P.O. Box No. 6-57, Junghe, Taipei 235 (TW)

( * ) Notice: Subject to any disclaimer, the term of this patent is extended or adjusted under 35 U.S.C. 154(b) by 55 days.

(21) Appl. No.: 10/825,226

(22) Filed: Apr. 16, 2004

(65) Prior Publication Data
US 2005/0157468 A1    Jul. 21, 2005

(30) Foreign Application Priority Data
Jan. 15, 2004    (TW) ............................... 93200705 U

(51) Int. Cl.[7] ............................................. H05K 7/20
(52) U.S. Cl. ................. 361/699; 165/80.4; 165/104.33
(58) Field of Search ............................. 361/699, 711; 165/80.4, 104.33; 257/714, 715

(56) References Cited

U.S. PATENT DOCUMENTS

| | | | | |
|---|---|---|---|---|
| 5,675,473 A | * | 10/1997 | McDunn et al. | 361/699 |
| 5,764,483 A | * | 6/1998 | Ohashi et al. | 361/699 |
| 5,831,824 A | * | 11/1998 | McDunn et al. | 361/699 |
| 6,442,023 B2 | * | 8/2002 | Cettour-Rose et al. | 361/690 |
| 6,609,561 B2 | * | 8/2003 | Sauciuc et al. | 165/104.33 |
| 6,763,880 B1 | * | 7/2004 | Shih | 165/80.4 |
| 6,819,561 B2 | * | 11/2004 | Hartzell et al. | 361/689 |

* cited by examiner

Primary Examiner—Anatoly Vortman
Assistant Examiner—Zachary Pape

(57) ABSTRACT

A computer cooling system devised with a computer housing, which is a sealed body and has a plurality of paths. An end portion of the sealed body is connected to a heat conducting plate via pipes thereof. The heat conducting plate is directly attached to a CPU, hard disc or other computer components that need heat dissipation. The paths of the housing are filled with a cooling liquid that is circulated between an interior of the housing and the heat conducting plate using a pump, thereby rapidly lowering temperatures of the computer components to which the heat conducting plate is attached. The housing is made of a material such as aluminum having a good thermal conductance coefficient. In conjunction with circulation of the cooling liquid, temperatures in the computer are rapidly exchanged by the housing and thus controlled within a recommended operating temperature range.

2 Claims, 5 Drawing Sheets

COMPUTER COOLING SYSTEM

BACKGROUND OF THE INVENTION (a) Field of the Invention

The invention relates to a computer cooling system, and more particularly, to a cooling system for enhancing heat dissipation efficiency of a computer.

(b) Description of the Prior Art

A computer has cores made of semiconductor electronic components at an interior thereof, and regards ambient operating temperatures thereof as rather crucial. The reason is that once the ambient operating temperatures exceed an upper limit thereof, algorithms of the computer are undesirably affected to lead to computer crashes in minor situation, or even component damages in worst cases. Also, current computers are advanced with faster and faster algorithm speeds, meaning that higher temperatures are easily incurred. In addition, requirements of heat dissipation stand more and more important in the modern micro manufacturing process.

An existing heat dissipating method is to install a certain quantity of fans at a computer housing, so that operating temperatures within the computer housing are controlled to stay at room temperature. Apart from the above, key components such as a central processing unit (CPU) and specific chips of the computer are attached with cooling fins for coordinating with the heat dissipating fans, thereby allowing these key components to operate within a recommended temperature range. However, when multiple sets of fans operate simultaneously, wind noises become quite noticeable while outputting unsatisfactory heat dissipation efficiency. More particularly, accompanied with miniaturization of computer hosts, the aforesaid conventional heat dissipation system is hardly capable of fulfilling heat dissipation requirements. Furthermore, such type of heat dissipation system that utilizes wind flows, along with stricter heat dissipation conditions, creates larger and larger airflows in and out of the computer housing to bring dust and dirt outside the computer housing to an interior thereof. When the computer is electrically conducted, the dust and dirt become adhered to various parts in the computer housing due to electrostatic effects generated by electric currents. Consequently, heat dissipation efficiency of these parts is significantly reduced to shorten lifespan of the computer.

Referring to FIG. 1, a heat dissipating device 10 tailored for a CPU and serving as a replacement of a conventional heat dissipating device having cooling fins operating in conjunction with fans, comprises a sealed water tank 11, a heat dissipating plate 12, a pump 13 at the heat dissipating plate 12, and a pipeline 14 connecting the water tank 11 and the pump 13. According to the heat dissipating device 10, the heat dissipating plate 12 is attached to a CPU 50, and the water tank 11 is installed to a fan of a computer housing. Water in the water tank 11 is circulated between the water tank 11 and the heat dissipating plate 12 using the pump 13, so as to guide high temperatures produced at surfaces of the CPU 50 to an interior of the water tank 11 for thermal exchange and further temperature lowering effects. However, this type of heat dissipating device 10 only targets at heat dissipation of the CPU and is inlaid at the interior of a computer host. Hence, this prior heat dissipating device still needs to coordinate with a conventional heat dissipating system to obtain sufficient heat dissipating effects. Although this prior heat dissipating device does elevate partial heat dissipation efficiency of the CPU, the water tank occupies a rather large space in the computer housing. To be more precise, this type of heat dissipating device is applicable only to large computer hosts.

SUMMARY OF THE INVENTION

The primary object of the invention is to provide a computer cooling system integrated with a housing, in that the cooling system utilizes large areas of the housing for elevating heat dissipating efficiency in and out of a computer host. Not only specific components in the computer hosts are provided with reinforced cooling effects, but also ambient operating temperatures in the housing are maintained within a certain range, thereby reliably lowering operating temperatures and promoting operation stability of the computer.

Referring to FIG. 2, a computer cooling system according to the invention comprises a housing 20, sealing panels 30 and a heat conducting plate 40.

With reference to FIGS. 3 and 4, the housing 20 is made of a material having a good thermal conductance coefficient such as aluminum, and is formed as a hollow square in shape by an inner panel 21, an outer panel 22 and a plurality of transverse partitions 23 between the inner and outer panels 21 and 22. Between two adjacent partitions 23 forms a path 25 penetrating through the housing 20, with front and rear end portions of the alternately developing into openings 24. That is, odd-number path 23 each has an opening 24 at a front end portion thereof, and each even-number path has an opening 24 at a rear end portion thereof. Thus, the paths 25 are distributed in communication, joined and located closely to one another at wall surfaces of the housing 20.

Each sealing panel 30 is formed in a shape identical to that of a cross section of the housing 20. The sealing panels 30 are joined at front and rear ends of the housing 20 such that an interior of the housing 20 becomes as a sealed environment. The sealing panels 30 have a water inlet 31 and a water outlet 32 that correspond with the paths 25 of the housing 20.

The heat conducting plate 40 is made of a material having a good thermal conductance coefficient, and has two pipes 41 thereof connected with the water inlet 31 and the water outlet 32 of the sealing panels 30. The heat conducting plate 40 further has a pump 42, and can be directly attached to a CPU or a hard disc of a computer.

According to the aforesaid structures, a cooling liquid is poured into the housing 20 to have the cooling liquid fill up the paths 25, the pipes 41 and an interior of the heat conducting plate 40. The cooling liquid is circulated between the paths 25, the pipes 41 and the heat conducting plate 40 when the pump 42 at the heat conducting plate 40 is in operation.

Referring to FIG. 5, to reduce production costs and mold expenses of the housing 20, the housing 20 is devised into a shape having a U-shaped cross section. End portions of the housing 20 are provided with an embedding strip 24 and an embedding slot 27. Two housings 20 having U-shape cross sections are first joined with each other by embedding means, and then joined with the sealing panels 30 into one body to form an integrated housing. Using the aforesaid characteristic, volumes of molds and semi-finished products are substantially reduced for lowering production costs.

DETAILED DESCRIPTION OF THE PREFERRED EMBODIMENTS

Figure 1:
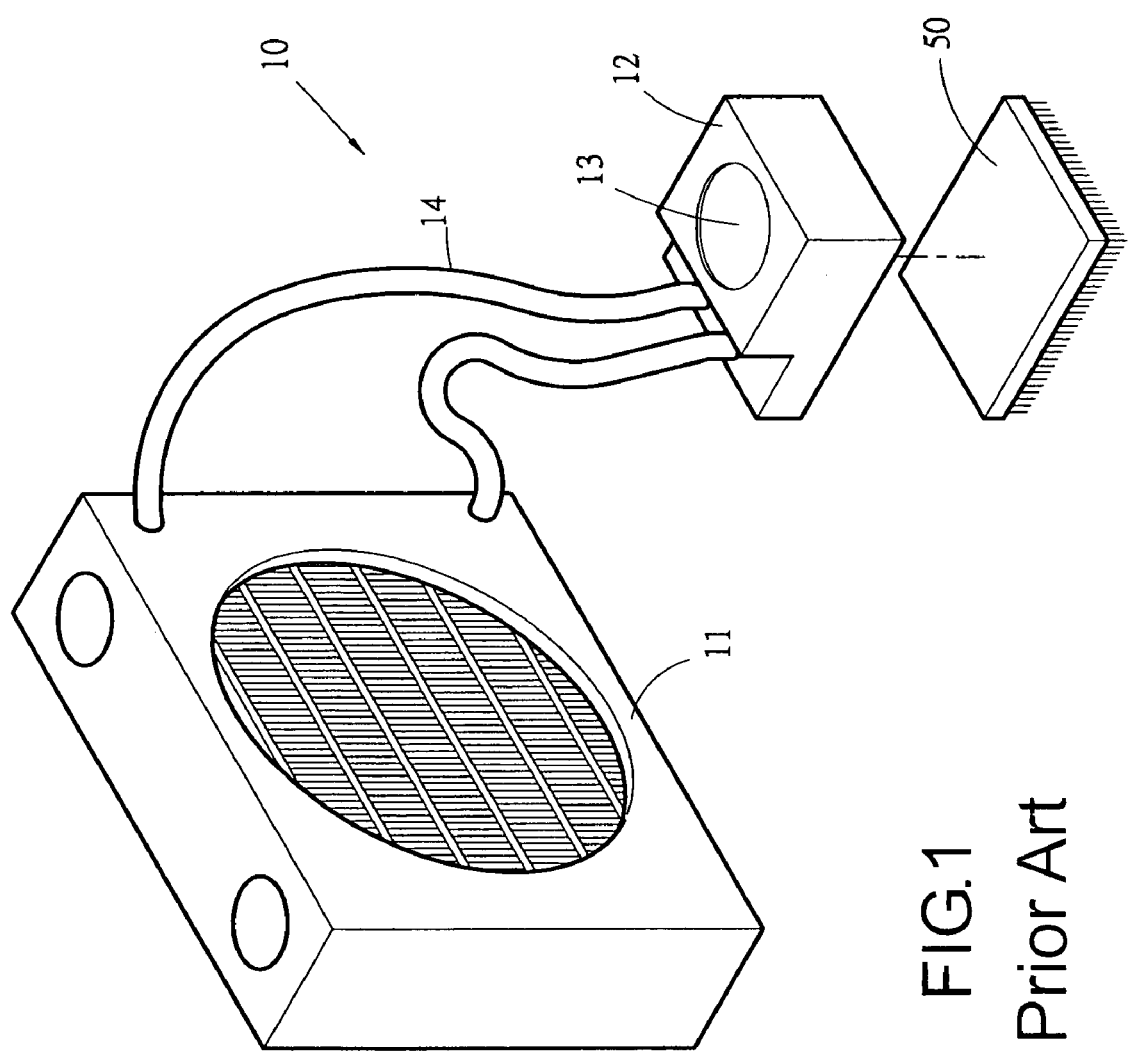
FIG. 1 shows an elevational schematic view of a prior heat dissipating device.
Figure 2:
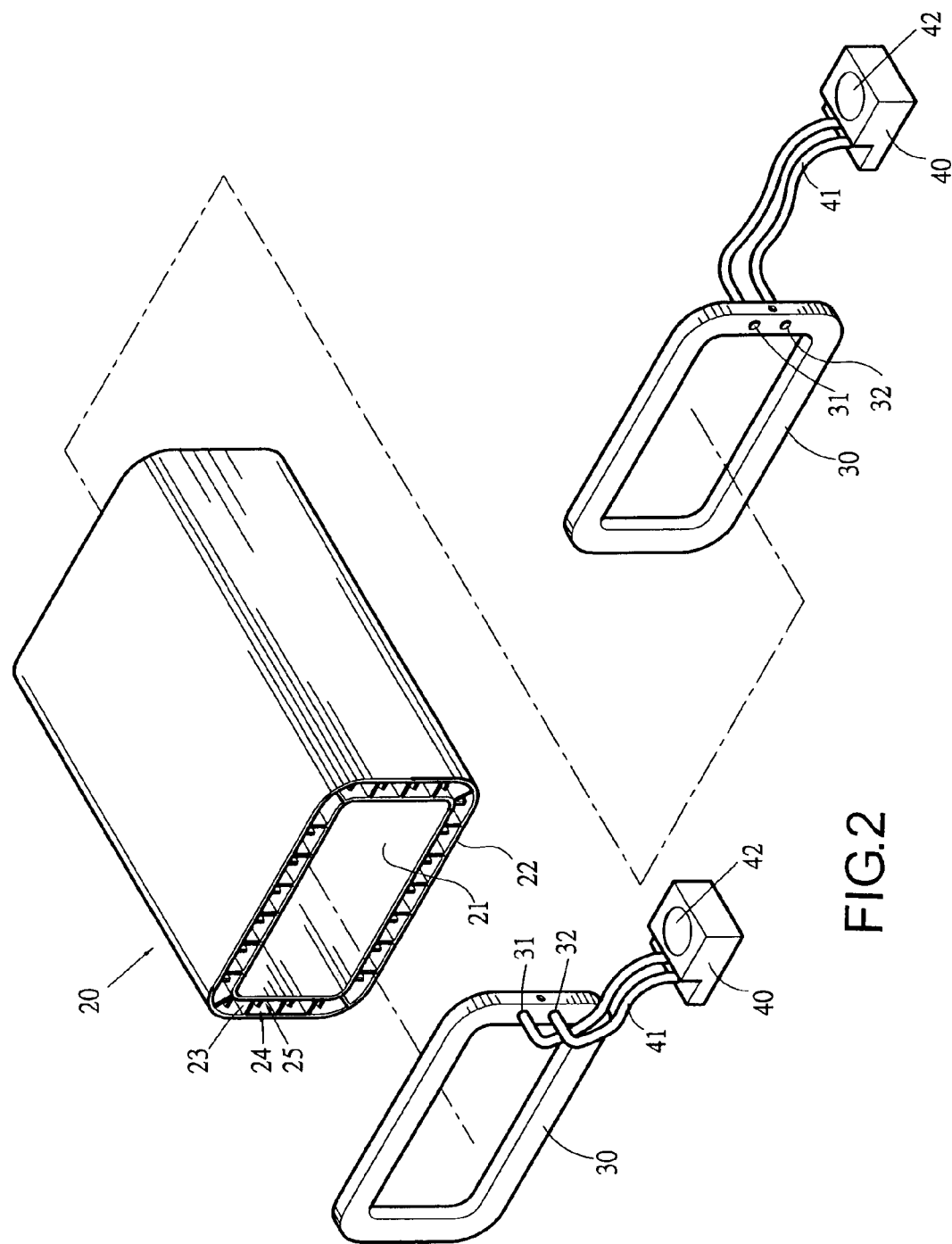
FIG. 2 shows an exploded elevational view illustrating various parts according to the invention.
Figure 3:
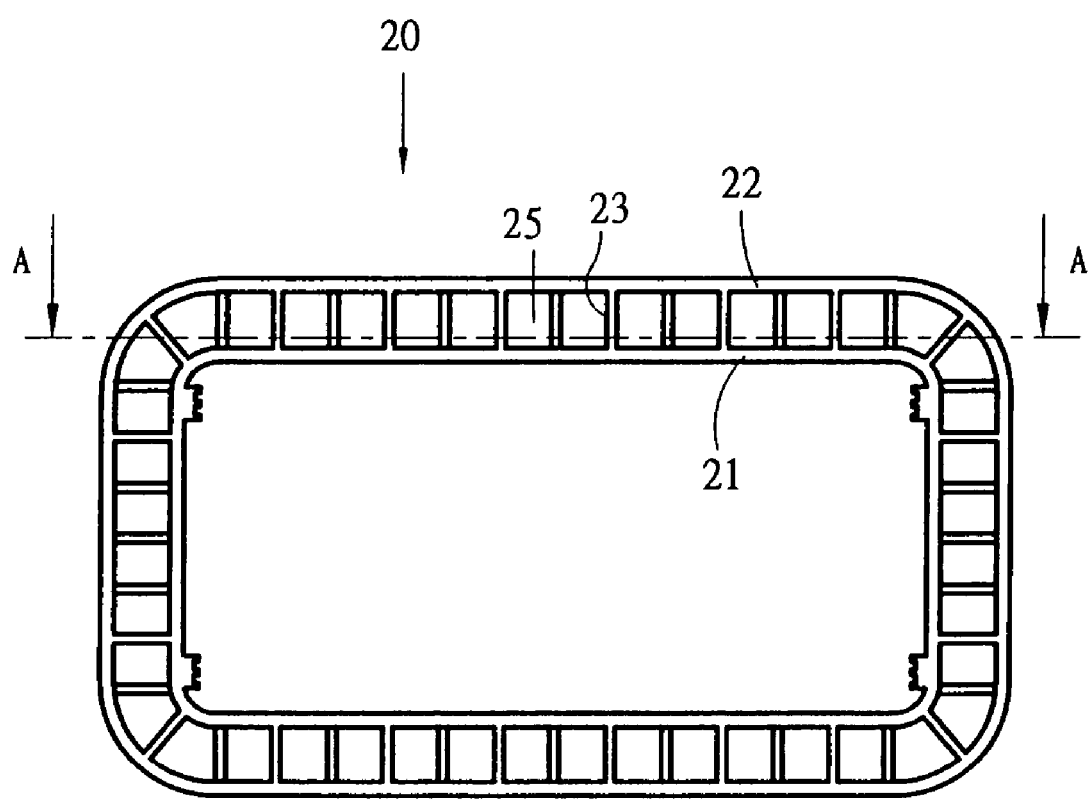
FIG. 3 shows a sectional view of the housing according to the invention.
Figure 4:
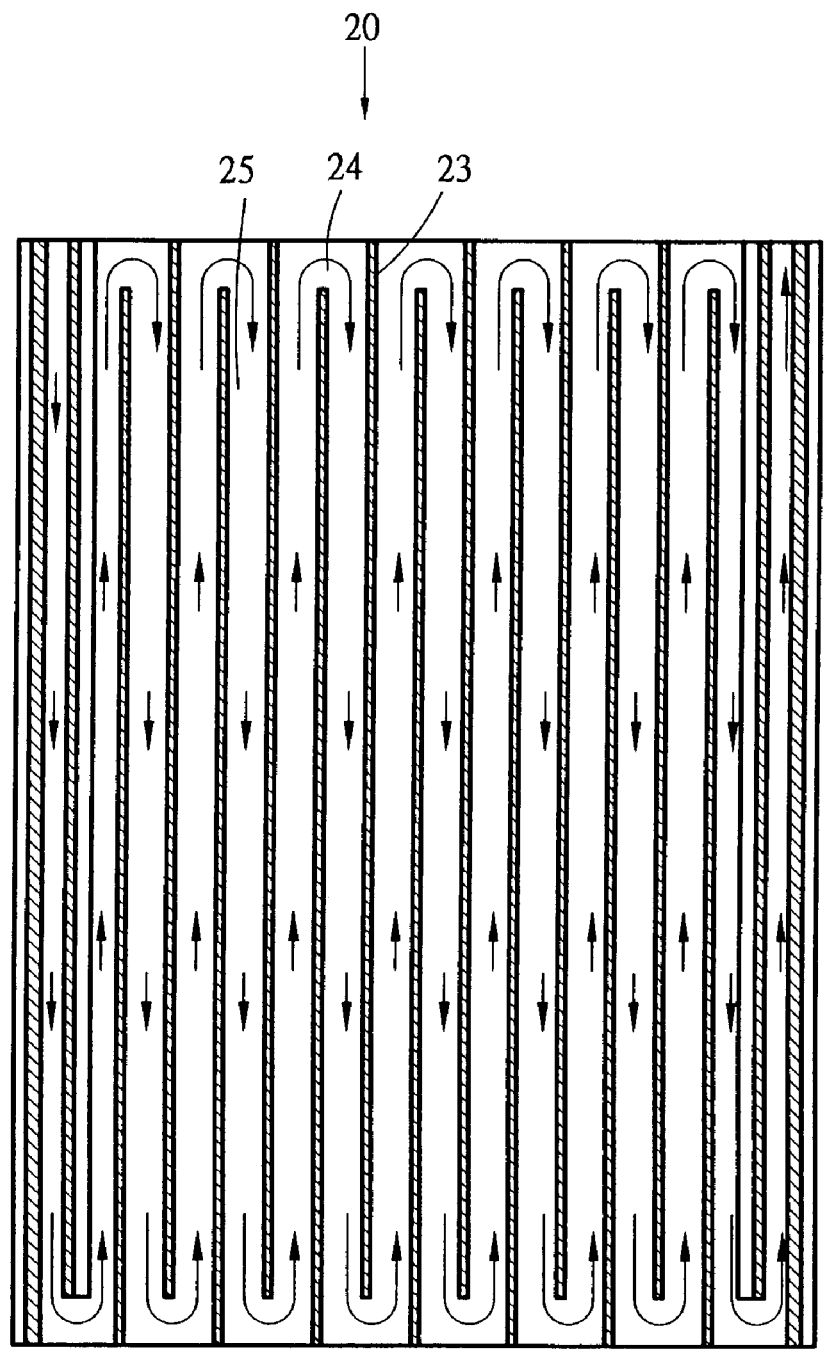
FIG. 4 shows a sectional view of FIG. 3 taken along A—A, and a diagram illustrating circulating routes of the cooling liquid being restricted.
Figure 5:
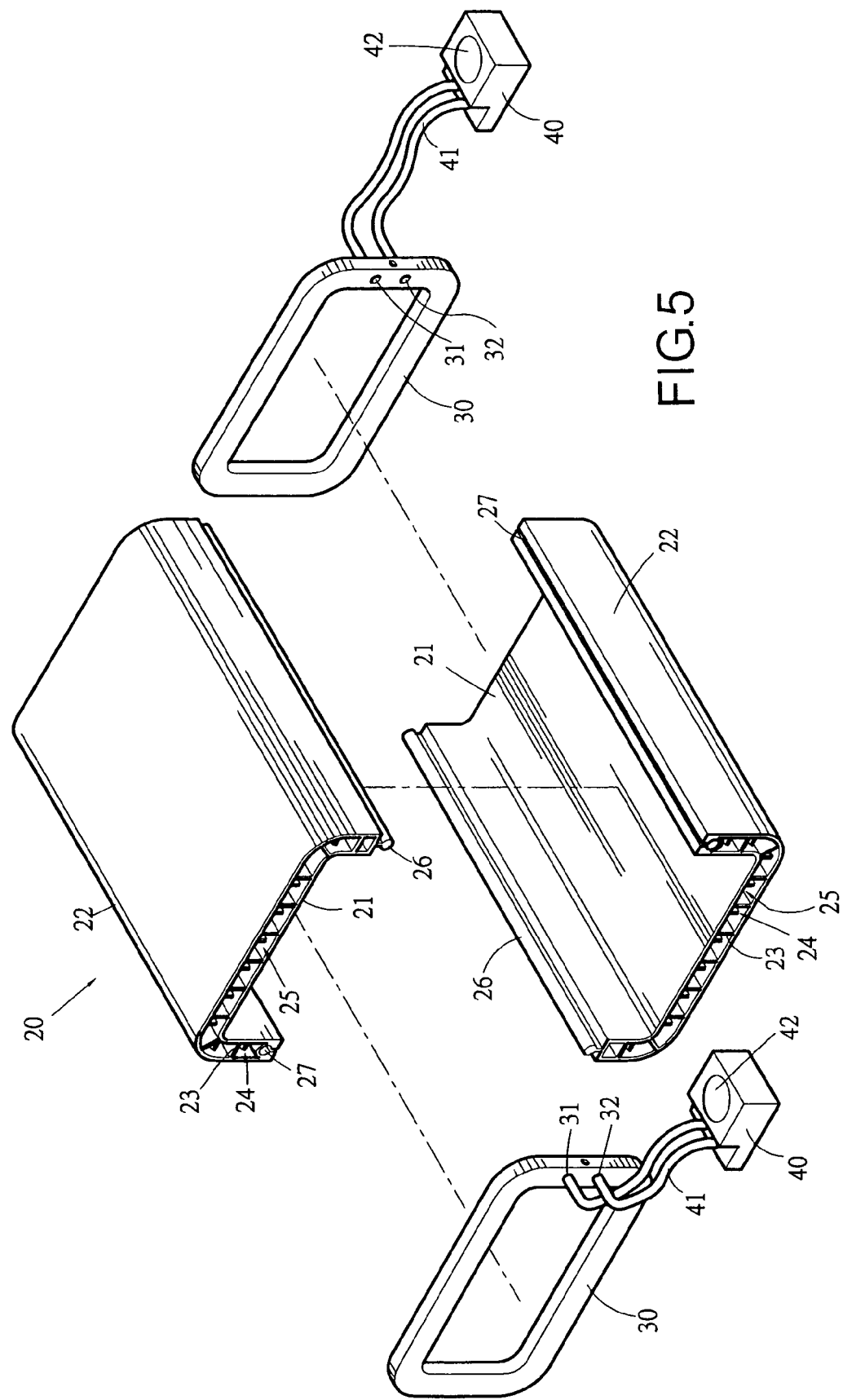
FIG. 5 shows a schematic view of the housing in an embodiment according to the invention.

To put the invention to use, the heat conducting plate 40 is directly adhered to a CPU, a hard disc or other computer components that need heat dissipation. Using circulation of the cooling liquid in the housing 20 and driven by the pump 42, thermal energy absorbed by the heat conducting plate 40 from the computer components are brought into the housing 20 for thermal exchange. It is to be note that, the housing 20 has large-area outer surfaces thereof in communication with an exterior, and the partitions 23 in the housing 20 are capable of effectively conducting heat while restricting circulating routes of the cooling liquid to increase contact time per unit cooling liquid with the housing 20. Therefore, the cooling liquid is allowed to convert to a temperature approaching room temperature in the housing 20, and to further be outputted to the heat conducting plate 40 for thermal exchange. Thus, thermal energy produced by the CPU, hard disc and computer components can rapidly undergo thermal exchange to lower temperatures thereof.

Apart from providing specific computer components with reinforced temperature lowering effects, using the partitions 23 and the cooling liquid, temperatures in the housing 20 can also be directly guided to outer walls of the housing 20 for heat dissipation, such that ambient operating temperatures in the computer are controlled within a recommended temperature range through thermal exchange performed by the housing 20. Thus, a quantity of fans required by the computer host can be reduced, and wind noises produced by the fans in operation can also be decreased. In addition, dust and dirt entering the housing 20 are minimized to maintain heat dissipation efficiency of the cooling system.

The invention is characterized that, a cooling liquid is stored by the housing, and both the cooling liquid and the housing are then utilized for thermal exchange. Spaces required are economized, and therefore the invention is suitable for whether large or small computer hosts.

It is of course to be understood that the embodiment described herein is merely illustrative of the principles of the invention and that a wide variety of modifications thereto may be effected by persons skilled in the art without departing from the spirit and scope of the invention as set forth in the following claims.

What is claimed is:

1. A computer cooling system comprising:

a housing made of a material having a good thermal conductance coefficient; formed as a shape of a hollow square; and having inner and outer housings, and a plurality of transverse partitions between the inner and outer housings; wherein paths penetrating through the housing are formed between two adjacent partitions, and front and rear ends of the paths alternately develop into openings (odd-number paths each having an opening at a front end portion thereof, and even number paths each having an opening at a rear end portion thereof), such that the paths are distributed in communication, joined and located closely to one another at wall surfaces of the housing;

sealing panels joined at front and rear ends of the housing such that an interior of the housing becomes as a sealed environment; and having a water inlet and a water outlet that correspond with the paths of the housing; and a heat conducting plate made of a material having a good thermal conductance coefficient; having two pipes thereof connected with the water inlet and the water outlet of the sealing panels, and a pump which can be directly a CPU or a hard disc of a computer; and according to the aforesaid structures, a cooling liquid is poured into the housing to have the cooling liquid fill up the paths, the pipes and an interior of the heat conducting plate; and the cooling liquid is circulated between the paths, the pipes and the heat conducting plate when the pump at the heat conducting plate is in operation.

2. The computer cooling system in accordance with claim 1, wherein the housing is devised into a shape having a U-shaped cross section; end portions of the housing are provided with an embedding strip and an embedding slot; two housings having U-shape cross sections are first joined with each other by embedding means, and then joined with the sealing panels into one body to form an integrated housing.

* * * * *